Figure 1:
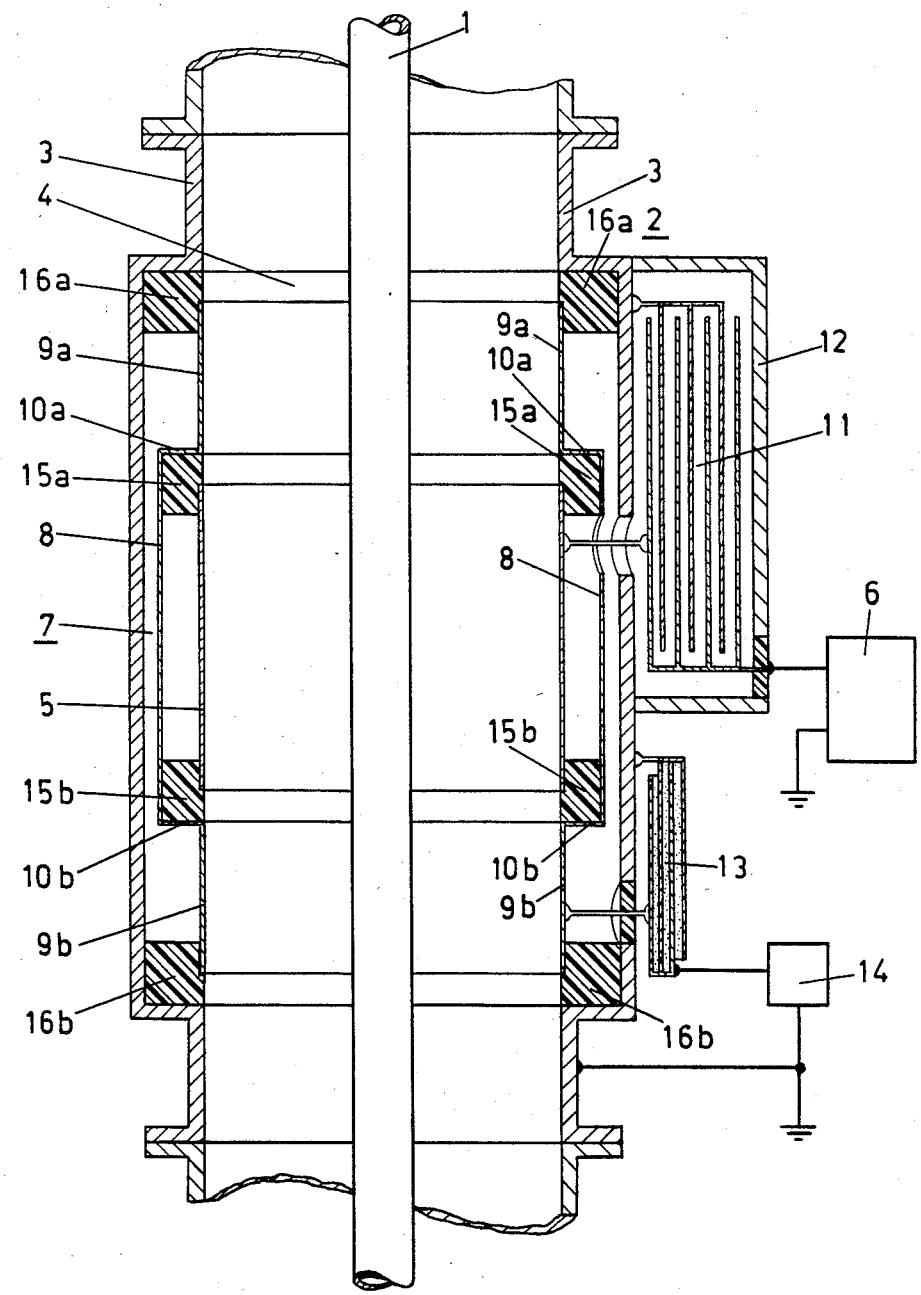

United States Patent [19]

Mastner

[11] Patent Number: 4,591,783

[45] Date of Patent: May 27, 1986

[54] CAPACITIVE VOLTAGE TRANSFORMER

[75] Inventor: Georg Mastner, Niederrohrdorf, Switzerland

[73] Assignee: BBC Brown, Boveri & Co., Ltd., Switzerland

[21] Appl. No.: 539,076

[22] Filed: Oct. 4, 1983

[30] Foreign Application Priority Data

Oct. 29, 1982 [CH] Switzerland .................. 6308/82

[51] Int. Cl.$^4$ .................. G01R 15/06; H01G 1/005
[52] U.S. Cl. .................. 324/126; 361/303; 361/324
[58] Field of Search .......... 324/126; 323/364; 361/328, 301, 302, 303

[56] References Cited

U.S. PATENT DOCUMENTS

| | | | |
|---|---|---|---|
| 3,396,339 | 8/1968 | Miram | 324/126 |
| 3,942,106 | 3/1976 | Hermstein et al. | 323/364 |
| 3,952,243 | 4/1976 | Herrmann et al. | 323/364 |
| 3,988,684 | 10/1976 | Müller et al. | 323/364 |

OTHER PUBLICATIONS

Technical Information Series No. 77 CRD 111, May 1977–New Techniques for Current and Voltage Measurement on Power Transmission Lines, p. 5, et seq. of the General Electric Company.

Smit-Mededelingen No. 4, 1969: The ESPOM, a Capacitor-Coupled Dlectronic Voltage Transformer from the Smit Nijmegen Electrotechnische Fabrieken N.V.

Primary Examiner—Stewart J. Levy
Assistant Examiner—Stephen M. Baker
Attorney, Agent, or Firm—Ostrolenk, Faber, Gerb & Soffen

[57] ABSTRACT

In this voltage transformer for compressed-gas insulated high-voltage systems, between a straight internal conductor (1), which is located in a gas space (4) and forms a high-voltage electrode, and a low-voltage electrode (3) surrounding the internal conductor in the gas space (4) a measuring electrode (5) is arranged at which an output voltage is tapped off and fed to a signal processing system (6). In order to reduce the dependence of the output voltage on tolerances and fluctuations of geometric parameters, a guard electrode (7) is arranged between the low-voltage electrode (3) and the measuring electrode (5) and a plate capacitor (11), which is located in insulating gas, is placed between the measuring electrode (5) and earth. Between the guard electrode (7) and earth a supplementary capacitor (13) is also placed which is dimensioned in such a way that the capacitive voltage dividers formed by the internal conductor (1), the measuring electrode (5) and earth, on the one hand, and the internal conductor (1) the guard electrode (7) and earth, on the other hand, have approximately the same transformation ratios. The guard electrode (7) is earthed via a compensating device (14) the impedance of which is dimensioned in such a way that the time constants for the discharges of the measuring electrode 5 and the guard electrode 7 are approximately equal.

22 Claims, 2 Drawing Figures

CAPACITIVE VOLTAGE TRANSFORMER

The invention relates to capacitive voltage transformers such as are used in encapsulated compressed-gas insulated high-voltage systems, especially in the case of voltages of more than 100 kV, for measuring the voltage of conductors which conduct alternating current. In this arrangement, a measuring electrode is arranged in a gas space between a high-voltage electrode carrying the voltage to be measured and an earthed low-voltage electrode. The high-voltage capacity between the high-voltage electrode and the measuring electrode and the low-voltage capacity between the measuring electrode and earth form a capacitive voltage divider which reflects the high voltage to be measured in analog fashion to an output voltage which is situated in a lower voltage range and which is suitable for feeding measuring electronics or measuring instruments. The transformation ratio, that is to say the quotient between output voltage and high voltage then approximately corresponds to the quotient between high-voltage capacity and low-voltage capacity.

Capacitive voltage transformers in accordance with the characterising clause of claim 1 are known, for example from "Technical Information Series No. 77 CRD 111, May 1977: New Techniques for Current and Voltage Measurement on Power Transmission Lines", page 5 et seq. of the General Electric Company and "Smit-Mededlingen No. 4, 1969: The ESPOM, a capacitor-coupled electronic voltage transformer" from the Smit Nijmegen Electrotechnische Fabrieken N.V.

In the capacitive voltage transformers described there, the measuring electrode and the low-voltage electrode are separated only by a gap which is filled with insulating gas and which must be very narrow in comparison with the dimensions of the electrodes if the low-voltage capacity is to be large enough to achieve an adequately small transformation ratio, especially since this capacity is formed exclusively by the capacity between the measuring electrode and the low-voltage electrode.

In such voltage transformers, the low-voltage capacity very sensitively depends on the geometry of the measuring electrode and of the low-voltage electrode and their mutual positioning. Slight changes in form or extent of one of these electrodes, for example as a result of temperature fluctuations, or a slight relative displacement of this electrode, are reflected in relatively drastic changes in the transformation ratio. If the voltage transformer has to meet high requirements as regards accuracy, the requirements with respect to the thermal coefficient of expansion of the materials, the mechanical stability of the construction and the precision during manufacture and installation are correspondingly high and the voltage transformer is correspondingly expensive.

This situation is to be improved by the invention. The objective of creating a capacitive voltage transformer which has high measuring accuracy over a wide range of boundary conditions and in which the requirements made on the quality of the material, mechanical stability and precision in manufacture and installation are kept within justifiable limits, is achieved by the invention as characterised in the claims.

The advantages achieved by the invention can be seen especially in the fact that the capacities, which are sensitively dependent on geometric parameters and can be kept under control only with difficulty, have only a relatively small effect on the transformation ratio of the voltage divider. For this reason, the permissible tolerances are considerably greater which substantially reduces the costs of manufacturing the voltage transformer.

Figure 2:
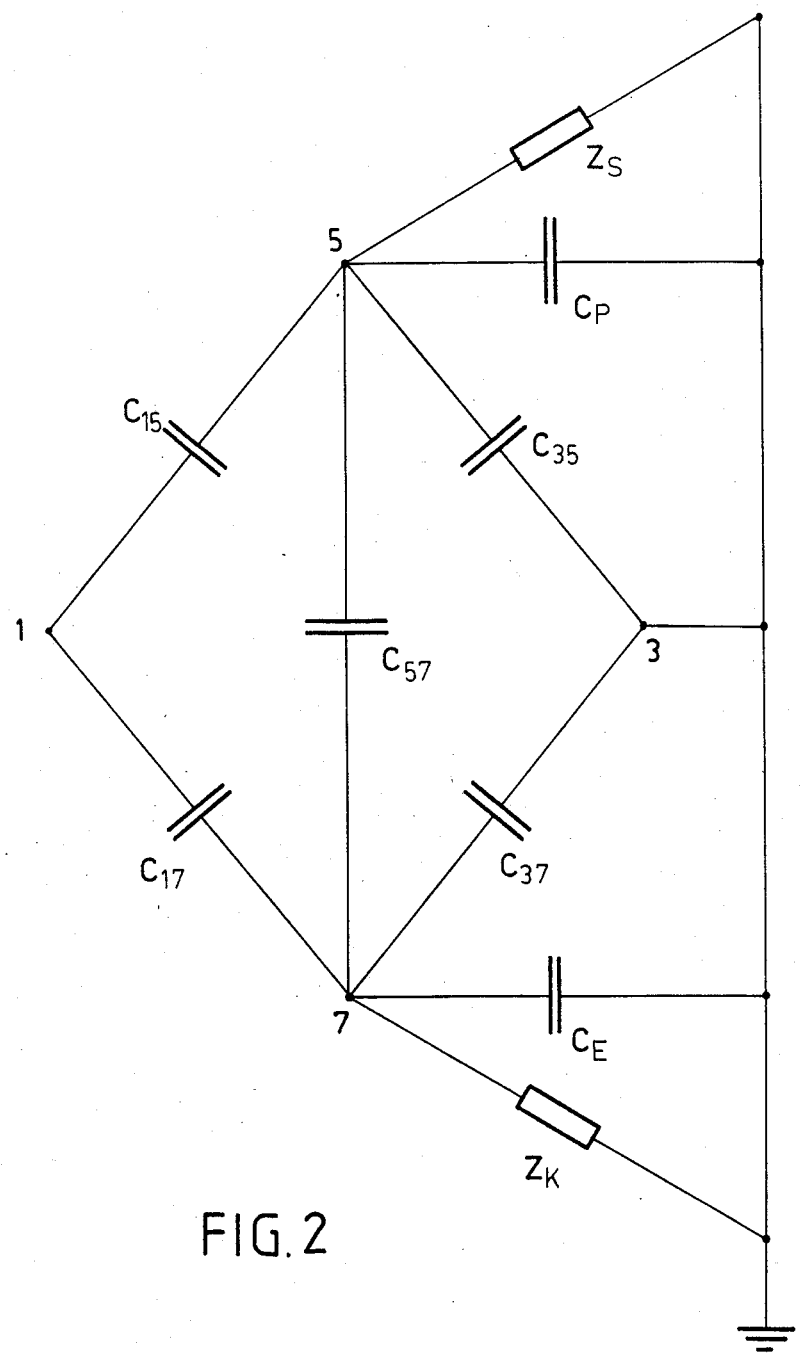

In the text which follows, the invention is represented with the aid of a drawing, showing only one type of embodiment, and a circuit diagram. In these:

FIG. 1 shows a longitudinal section through a capacitive voltage transformer according to the invention, and FIG. 2 shows an equivalent circuit in which the capacities and other impedances occurring in the capacitive voltage transformer according to the invention are shown.

In FIG. 1 a capacitive voltage transformer is shown which, in its basic configuration, contains a high-voltage electrode which is formed by a section of an internal conductor 1 constructed as a straight conducting tube, a low-voltage electrode 3 which simultaneously forms a part of the housing 2 and co-axially surrounds the internal conductor 1 and which partially encloses a gas space 4, and a measuring electrode 5 which has the shape of a cylindrical jacket and is arranged in the gas space 4 and also coaxially surrounds the internal conductor. The voltage tapped off the measuring electrode 5 is passed on to a signal processing device 6 which is preferably constructed as measuring electronics in which the measuring signal is processed in a digital or analog manner. Such measuring electronics are described, for example, in German Offenlegungsschrift No. 2,816,647.

According to the invention, a guard electrode 7 is arranged between the low-voltage electrode 3 and the measuring electrode 5 in the gas space 4, and between the measuring electrode 5 and earth an additional capacitor is placed which meets high requirements with respect to stability. The guard electrode 7 has three parts in the shape of cylindrical jackets and coaxially surrounding the internal conductor 1, a first part 8 which surrounds the outside of the measuring electrode 5 and a second and a third part 9a and 9b, which have the same diameter as the measuring electrode 5 and, in each case located in the continuation in axial direction of the latter, on both sides join the first part 8. The connection between the first part 8 and the second part 9a and the third part 9b, respectively, is made by circular parts 10a and 10b respectively. The additional capacitor is constructed as a plate capacitor 11 and housed in a container 12 which is connected to the gas space 4. The guard electrode 7 is electrically conductively connected to an electrode of a supplementary capacitor 13 the other electrode of which is earthed. The supplementary capacitor 13 can be constructed, for example, as a mica capacitor. The guard electrode 7 is additionally earthed via a compensating device 14. The measuring electrode 5 is supported by insulating parts 15a, 15b on the guard electrode 7 and the guard electrode is supported via insulating parts 16a, 16b on the low-voltage electrode 3.

FIG. 2 shows an equivalent circuit in which the capacities and other impedances occurring at the voltage transformer according to the invention are illustrated. In this equivalent circuit the points designated by numbers represent the parts of the voltage transformer designated by the same number in FIG. 1 and carry the potentials across these parts. Accordingly, $C_{15}$ and $C_{17}$ represent the capacities between the internal conductor 1 and the measuring electrode 5 and the guard electrode 7, respectively, $C_{35}$ and $C_{37}$ represent those between the low-voltage electrode 3 and the measuring electrode 5 and the guard electrode 7, respectively, similarly, $C_{57}$ stands for the capacity between the measuring electrode 5 and the guard electrode 7. $C_p$ and $C_E$ represent the capacities of the plate capacitor 11 and the supplementary capacitor 13, respectively, $Z_S$ the input impedance of the signal processing device 6 and $Z_K$ the impedance of the compensating device 14.

The voltage transformer according to the invention contains two parallel capacitive voltage dividers, a first one which is formed by the capacity $C_{15}$ between the internal conductor 1 and the measuring electrode 5 as high-voltage capacity and the capacity of the measuring electrode 5 with respect to earth inclusive of the capacity $C_p$ of the plate capacitor 11 as the low-voltage capacity, and a second one which is formed by the capacity $C_{17}$ between the internal conductor 1 and the guard electrode 7 as the high-voltage capacity and the capacity of the guard electrode 7 with respect to earth inclusive of the capacity $C_E$ of the supplementary capacitor 13 as the low-voltage capacity. The two voltage dividers are coupled by the capacity $C_{57}$ between the measuring electrode 5 and the guard electrode 7.

At the first voltage divider, the output voltage is tapped off at the measuring electrode 5. As a result of the shielding by the guard electrode 7 between these two electrodes, the capacity $C_{35}$ between the low-voltage electrode 3 and the measuring electrode 5 is very small. The low-voltage capacity, which is determining for the transformation ratio of the voltage divider, is formed almost exclusively by the capacity $C_P$ of the plate capacitor 11.

The trivial role played by the capacity $C_{35}$ between the low-voltage electrode 3 and the measuring electrode 5 results in a considerably improved stability of the transformation ratio with respect to tolerances in the geometry of the low-voltage electrode 3 and of the measuring electrode 5 and their relative position since the high-voltage capacity $C_{15}$ between the internal conductor 1 and the measuring electrode 5 is less sensitively dependent on installation tolerances. A high temperature stability of the transformation ratio is given especially when the interior of the container 12 in which the plate capacitor 11 is located is connected to the gas space 4 since then fluctuations in the dielectric constant of the insulating gas caused by temperature or density fluctuations can have no effect.

The fact that the first voltage divider is coupled by the capacity $C_{57}$, which is relatively sensitive with respect to geometric tolerances, between the measuring electrode 5 and the guard electrode 7 to the second voltage divider, which, with the capacity $C_{37}$ between the low-voltage electrode 3 and the guard electrode 7, has a capacity which is also sensitive with respect to geometric tolerances, could make the result of measurements dependent on the abovementioned capacities $C_{57}$ and $C_{37}$ and thus again sensitively dependent on geometric parameters if a current, which is not negligible with respect to the current flowing via the capacity $C_{15}$ between the internal conductor 1 and the measuring electrode 5, were to flow via the capacity $C_{57}$ between the measuring electrode 5 and the guard electrode 7. Such an interfering effect is eliminated, however, if the capacity $C_{37}$ between the low-voltage electrode 3 and the guard electrode 7 is supplemented by the capacity $C_E$ of the supplementary capacitor 13 and this capacity is dimensioned in such a manner that the transformation ratio of the second voltage divider is approximately equal to the transformation ratio of the first voltage divider. By this means, approximately the same potential is applied at the measuring electrode 5 and at the guard electrode 7 and the current flowing via the capacity $C_{57}$ between these two electrodes is negligibly small. A capacity, which in the generic voltage transformer is especially critically dependent on geometric parameters, between the measuring electrode and the electrode which surrounds the latter on the outside and which greatly affects the output voltage in the known voltage transformers, then hardly affects the output voltage in the voltage transformer according to the invention since approximately the same potential is applied to the electrode surrounding the measuring electrode on the outside, in this case the guard electrode, as is applied to the measuring electrode and thus hardly any current flows via the critical capacities.

So that the approximate equality of potentials at the measuring electrode 5 and the guard electrode 7 is preserved even during transient events, the guard electrode 7 is earthed via the compensating device 14, the impedance $Z_K$ of which is dimensioned in such a way that the time constants for the discharges of the measuring electrode 5 and the guard electrode 7 are approximately equal.

The permissible deviation of the transformation ratio of the second voltage divider from that of the first voltage divider depends on the requirements as regards accuracy of the voltage transformer, the degree of coupling, that is to say the magnitude of the capacity $C_{57}$ between the measuring electrode 5 and the guard electrode 7 and other parameters. In general, deviations of ±20% can be tolerated with an optimum geometric design. In any case, the requirements on the stability of the capacities for the second voltage divider are much less stringent than for the first voltage divider. The supplementary capacitor 13 can, therefore, also be constructed, for example, as a mica capacitor as has already been mentioned and can be arranged outside the housing.

It would theoretically also be possible to omit the supplementary capacitor 13 and to connect the guard electrode 7 to the output of an amplifier with a gain of +1 at the input of which the output voltage tapped off the measuring electrode 5 is present. However, this method would be rather costly because of the relatively high voltages at the measuring electrode and guard electrode and would also be limited in frequency range and, for example, the detection of transients would therefore be adversely affected.

The special geometry of the voltage transformer described here, in which the parts 9a, 9b of the guard electrode 7 are arranged in the continuation in axial direction of the measuring electrode 5 results in a homogeneous field distribution in the area of the measuring electrode 5 and reduces the sensitivity of the capacities with respect to axial displacements of the electrodes. This effect is reinforced by the fact that parts of the inner wall of the low-voltage electrode 3 are in each case located in the continuation of the said parts 9a, 9b of the guard electrode 7.

The homogeneity of the field distribution is especially marked in the case of capacitive voltage transformers of the type described here in which a straight internal conductor, which forms the high-voltage electrode, is coaxially surrounded by the remaining electrodes. It is apparent, however, that the invention can also be advantageously used with capacitive voltage dividers of different construction, for example of the type described in the printed document mentioned in second paragraph.

I claim:

1. A device for measuring the voltage of a part, which carries high voltage, of an encapsulated, compressed-gas insulated high-voltage system, having a housing (2) which at least partially encloses a gas space (4) which contains a high-voltage electrode (1), an earthed low-voltage electrode (3) which at least partially surrounds the high-voltage electrode, having a measuring electrode (5) which is arranged in the gas space (4) essentially between the high-voltage electrode and the low-voltage electrode and having a signal processing device (6) to which the voltage tapped off the measuring electrode (5) is fed,
   a guard electrode (7) arranged in the gas space (4) of which electrode at least a part is located between the measuring electrode (5) and the low-voltage electrode,
   an additional capacitor (11) one electrode of which is electrically conductively connected to said measuring electrode (5) and the other electrode of which is earthed;
   said additional capacitor is constructed as a plate capacitor (11) and is arranged in a container (12) which is connected to the gas space (4); a supplementary capacitor (13) one electrode of which is electrically conductively connected to the guard electrode (7) and the other electrode of which is earthed.

2. A device for measuring the voltage of a part, which carries high voltage, of an encapsulated, compressed-gas insulated high-voltage system, having a housing (2) which at least partially encloses a gas space (4) which contains a high-voltage electrode (1), an earthed low-voltage electrode (3) which at least partially surrounds the high-voltage electrode, having a measuring electrode (5) which is arranged in the gas space (4) essentially between the high-voltage electrode and the low-voltage electrode and having a signal processing device (6) to which the voltage tapped off the measuring electrode (5) is fed;
   a guard electrode (7) arranged in the gas space (4) of which electrode at least a part is located between the measuring electrode (5) and the low-voltage electrode;
   an additional capacitor (11) one electrode of which is electrically conductively connected to said measuring electrode (5) and the other electrode which is earthed;
   a supplementary capacitor (13) one electrode of which is electrically conductively connected to the guard electrode (7) and the other electrode of which is earthed; said device characterised in that the transformation ratio of the voltage divider formed by the capacity between the high-voltage electrode and said guard electrode (7) as the high-voltage capacity and said capacity of the guard electrode (7) with respect to earth as the low-voltage capacity deviates from the transformation ratio of the voltage divider formed by the capacity between said high-voltage electrode and said measuring electrode (5) as the high-voltage capacity and the capacity of said measuring electrode (5) with respect to earth, inclusively of the capacity of said additional capacitor, as the low-voltage capacity by less than 20%.

3. A device for measuring the voltage of a part, which carries high voltage, of an encapsulated, compressed-gas insulated high-voltage system, having a housing (2) which at least partially encloses a gas space (4) which contains a high-voltage electrode (1), an earthed low-voltage electrode (3) which at least partially surrounds the high-voltage electrode, having a measuring electrode (5) which is arranged in the gas space (4) essentially between the high-voltage electrode and the low-voltage electrode and having a signal processing device (6) to which the voltage tapped off the measuring electrode (5) is fed;
   a guard electrode (7) arranged in the gas space (4) of which electrode at least a part is located between the measuring electrode (5) and the low-voltage electrode;
   an additional capacitor (11) one electrode of which is electrically conductively connected to said measuring electrode (5) and the other electrode of which is earthed; said additional capacitor is constructed as a plate capacitor (11) and is arranged in a container (12) which is connected to the gas space (4);
   said device characterised in that the transformation ratio of the voltage divider formed by the capacity between the high-voltage electrode and said guard electrode (7) as the high voltage capacity of said guard electrode (7) with respect to earth as the low-voltage capacity deviates from the transformation ratio of the voltage divider formed by the capacity between said high-voltage electrode and said measuring electrode (5) as the high-voltage capacity and the capacity of said measuring electrode (5) with respect to earth, inclusively of the capacity of said addtional capacitor, as the low-voltage capacity by less than 20%; a supplementary capacitor (13) one electrode of which is electrically conductively connected to the guard electrode (7) and the other electrode of which is earthed.

4. A device for measuring the voltage of a part, which carries high voltage, of an encapsulated, compressed-gas insulated high-voltage system, having a housing (2) which at least partially encloses a gas space (4) which contains a high-voltage electrode (1), an earthed low-voltage electrode (3) which at least partially surrounds the high-voltage electrode, having a measuring electrode (5) which is arranged in the gas space (4) essentially between the high-voltage electrode and the low-voltage electrode and having a signal processing device (6) to which the voltage tapped off the measuring electrode (5) is fed,
   a guard electrode (7) arranged in the gas space (4) of which electrode at least a part is located between the measuring electrode (5) and the low-voltage electrode,
   an additional capacitor (11) one electrode of which is electrically conductively connected to said measuring electrode (5) and the other electrode of which is earthed; said guard electrode (7) is earthed via a compensating device (14) the impedance of which is dimensioned in such a way that the time constants for the discharges of the measuring electrode (5) and the guard electrode (7) are at least approximately equal.

5. A device for measuring the voltage of a part, which carries high voltage, of an encapsulated, compressed-gas insulated high-voltage system, having a housing (2) which at least partially encloses a gas space (4) which contains a high-voltage electrode (1), an earthed low-voltage electrode (3) which at least partially surrounds the high-voltage electrode, having a measuring electrode (5) which is arranged in the gas space (4) essentially between the high-voltage electrode and the low-voltage electrode and having a signal processing device (6) to which the voltage tapped off the measuring electrode (5) is fed;

a guard electrode (7) arranged in the gas space (4) of which electrode at least a part is located between the measuring electrode (5) and the low-voltage electrode, an additional capacitor 11 one electrode of which is electrically conductively connected to said measuring electrode (5) and the other electrode of which is earthed; said high-voltage electrode being a cylindrical shape and said measuring electrode (5) being constructed in the shape of a cylindrical jacket and which coaxially surrounds said high-voltage electrode;

said guard electrode has three parts in the shape of cylindrical jackets, a first part (8) which coaxially surrounds the measuring electrode (5) and extends past it on both sides in axial direction, and a second and a third part (9a, 9b) which in each case have the same diameter as the measuring electrode (5) and on both sides join the first part coaxially surrounding the high-voltage electrode.

6. A device according to claim 5, characterised in that said low-voltage electrode (3) extends in axial direction on both sides past the guard electrode (7) and its inner wall is constructed at least partially in the shape of a cylindrical jacket at the parts extending past the guard electrode (7), said inner wall is located coaxially with respect to the high-voltage electrode and has the same radius as the measuring electrode (5).

7. A device for measuring the voltage of a part, which carries high voltage, of an encapsulated, compressed-gas insulated high-voltage system, having a housing (2) which at least partially encloses a gas space (4) which contains a high-voltage electrode (1), an earthed low-voltage electrode (3) which at least partially surrounds the high-voltage electrode, having a measuring electrode (5) which is arranged in the gas space (4) essentially between the high-voltage electrode and the low-voltage electrode and having a signal processing device (6) to which the voltage tapped off the measuring electrode (5) is fed;

a guard electrode (7) arranged in the gas space (4) of which electrode at least a part is located between the mesuring electrode (5) and the low-voltage electrode, an additional capacitor 11 one electrode of which is electrically conductively connected to said measuring electrode (5) and the other electrode of which is earthed; said additional capacitor is constructed as a plate capacitor (11) and is arranged in a container (12) which is connected to the gas space (4);

said guard electrode (7) is earthed via a compensating device (14) the impedance of which is dimensioned in such a way that the time constants for the discharges of the measuring electrode (5) and the guard electrode (7) are at least approximately equal.

8. A device for measuring the voltage of a part, which carries high voltage, of an encapsulated, compressed-gas insulated high-voltage system, having a housing (2) which at least partially encloses a gas space (4) which contains a high-voltage electrode (1), an earthed low-voltage electrode (3) which at least partially surrounds the high-voltage electrode, having a measuring electrode (5) which is arranged in the gas space (4) essentially between the high-voltage electrode and the low-voltage electrode and having a signal processing device (6) to which the voltage tapped off the measuring electrode (5) is fed;

a guard electrode (7) arranged in the gas space (4) of which electrode at least a part is located between the measuring electrode (5) and the low-voltage electrode, an additional capacitor 11 one electrode of which is electrically conductively connected to said measuring electrode (5) and the other electrode of which is earthed; said additional capacitor is constructed as a plate capacitor (11) and is arranged in a container (12) which is connected to the gas space (4);

said high-voltage electrode being a cylindrical shape and said measuring electrode (5) being constructed in the shape of a cylindrical jacket and which coaxially surrounds said high-voltage electrode;

said guard electrode has three parts in the shape of cylindrical jackets, a first part (8) which coaxially surrounds the measuring electrode (5) and extends past it on both sides in axial direction, and a second and a third part (9a, 9b), which in each case have the same diameter as the measuring electrode (5) and on both sides join the first part coaxially surrounding the high-voltage electrode.

9. A device according to claim 8, characterised in that said low-voltage electrode (3) extends in axial direction on both sides past the guard electrode (7) and its inner wall is constructed at least partially in the shape of a cylindrical jacket at the parts extending past the guard electrode (7), said inner wall is located coaxially with respect to the high-voltage electrode and has the same radius as the measuring electrode (5).

10. A device for measuring the voltage of a part, which carries high voltage, of an encapsulated, compressed-gas insulated high-voltage system, having a housing (2) which at least partially encloses a gas space (4) which contains a high-voltage electrode (1), an earthed low-voltage electrode (3) which at least partially surrounds the high-voltage electrode, having a measuring electrode (5) which is arranged in the gas space (4) essentially between the high-voltage electrode and the low-voltage electrode and having a signal processing device (6) to which the voltage tapped off the measuring electrode (5) is fed;

a guard electrode (7) arranged in the gas space (4) of which electrode at least a part is located between the measuring electrode (5) and the low-voltage electrode, an additional capacitor 11 one electrode of which is electrically conductively connected to said measuring electrode (5) and the other electrode of which is earthed; said additional capacitor is constructed as a plate capacitor (11) and is arranged in a container (12) which is connected to the gas space (4);

said device characterised in that the transformation ratio of the voltage divider formed by the capacity between the high-voltage electrode and said guard electrode (7) as the high voltage capacity of said guard electrode (7) with respect to earth as the low-voltage capacity deviates from the transformation ratio of the voltage divider formed by the capacity between said high-voltage electrode and said measuring electrode (5) as the high-voltage capacity and the capacity of said measuring electrode (5) with respect to earth, inclusively of the capacity of said addtional capacitor, as the low-voltage capacity by less than 20%; said guard electrode (7) is earthed via a compensating device (14) the impedance of which is dimensioned in such a way that the time constants for the discharges of the measuring electrode (5) and the guard electrode (7) are at least approximately equal.

11. A device for measuring the voltage of a part, which carries high voltage, of an encapsulated, compressed-gas insulated high-voltage system, having a housing (2) which at least partially encloses a gas space (4) which contains a high-voltage electrode (1), an earthed low-voltage electrode (3) which at least partially surrounds the high-voltage electrode, having a measuring electrode (5) which is arranged in the gas space (4) essentially between the high-voltage electrode and the low-voltage electrode and having a signal processing device (6) to which the voltage tapped off the measuring electrode (5) is fed;

a guard electrode (7) arranged in the gas space (4) of which electrode at least a part is located between the measuring electrode (5) and the low-voltage electrode, an additional capacitor 11 one electrode of which is electrically conductively connected to said measuring electrode (5) and the other electrode of which is earthed; said additional capacitor is constructed as a plate capacitor (11) and is arranged in a container (12) which is connected to the gas space (4);

said device characterised in that the transformation ratio of the voltage divider formed by the capacity between the high-voltage electrode and said guard electrode (7) as the high voltage capacity of said guard electrode (7) with respect to earth as the low-voltage capacity deviates from the transformation ratio of the voltage divider formed by the capacity between said high-voltage electrode and said measuring electrode (5) as the high-voltage capacity and the capacity of said measuring electrode (5) with respect to earth, inclusively of the capacity of said addtional capacitor, as the low-voltage capacity by less than 20%; said a high-voltage electrode being a cylindrical shape and said measuring electrode (5) being constructed in the shape of a cylindrical jacket and which coaxially surrounds the high-voltage electrode;

said guard electrode has three parts in the shape of cylindrical jackets, a first part (8) which coaxially surrounds the measuring electrode (5) and extends past it on both sides in axial direction, and a second and a third part (9a, 9b), which in each case have the same diameter as the measuring electrode (5) and on both sides join the first part coaxially surrounding the high-voltage electrode.

12. A device according to claim 11, characterised in that the low-voltage electrode (3) extends in axial direction on both sides past the guard electrode (7) and its inner wall is constructed at least partially in the shape of a cylindrical jacket at the parts extending past the guard electrode (7), said inner wall is located coaxially with respect to the high-voltage electrode and has the same radius as the measuring electrode (5).

13. A device according to claim 3, characterised in that said guard electrode (7) is earthed via a compensating device (14) the impedance of which is dimensioned in such a way that the time constants for the discharges of the measuring electrode (5) and the guard electrode (7) are at least approximately equal.

14. A device according to claim 3, having said high-voltage electrode being a cylindrical shape and said measuring electrode (5) which is constructed in the shape of a cylindrical jacket and which coaxially surrounds said high voltage electrode;

said guard electrode has three parts in the shape of cylindrical jackets, a first part (8) which coaxially surrounds the measuring electrode (5) and extends past it on both sides in axial direction, and a second and a third part (9a, 9b), which in each case have the same diameter as the measuring electrode (5) and on both sides join the first part coaxially surrounding the high-voltage electrode.

15. A device according to claim 14, characterised in that said low-voltage electrode (3) extends in axial direction on both sides past the guard electrode (7) and its inner wall is constructed at least partially in the shape of a cylindrical jacket at the parts extending past the guard electrode (7), said inner wall is located coaxially with respect to the high-voltage electrode and has the same radius as the measuring electrode (5).

16. A device according to claim 4, having said high-voltage electrode being a cylindrical shape and said measuring electrode (5) being constructed in the shape of a cylindrical jacket and which coaxially surrounds the high-voltage electrode;

said guard electrode has three parts in the shape of cylindrical jackets, a first part (8) which coaxially surrounds the measuring electrode (5) and extends past it on both sides in axial direction, and a second and a third part (9a, 9b), which in each case have the same diameter as the measuring electrode (5) and on both sides join the first part coaxially surrounding the high-voltage electrode.

17. A device according to claim 16, characterised in that said low-voltage electrode (3) extends in axial direction on both sides past the guard electrode (7) and its inner wall is constructed at least partially in the shape of a cylindrical jacket at the parts extending past the guard electrode (7), said inner wall is located coaxially with respect to the high-voltage electrode and has the same radius as the measuring electrode (5).

18. A device for measuring the voltage of a part, which carries high voltage, of an encapsulated, compressed-gas insulated high-voltage system, having a housing (2) which at least partially encloses a gas space (4) which contains a high-voltage electrode (1), an earthed low-voltage electrode (3) which at least partially surrounds the high-voltage electrode, having a measuring electrode (5) which is arranged in the gas space (4) essentially between the high-voltage electrode and the low-voltage electrode and having a signal processing device (6) to which the voltage tapped off the measuring electrode (5) is fed;

a guard electrode (7) arranged in the gas space (4) of which electrode at least a part is located between the measuring electrode (5) and the low-voltage electrode, an additional capacitor 11 one electrode of which is electrically conductively connected to said measuring electrode (5) and the other electrode of which is earthed; said additional capacitor is constructed as a plate capacitor (11) and is arranged in a container (12) which is connected to the gas space (4);

characterised in that the transformation ratio of the voltage divider formed by the capacity between the high-voltage electrode and the guard electrode (7) as the high-voltage capacity and the capacity of the guard electrode (7) with respect to earth as the low-voltage capacity deviates from the transformation ratio of the voltage divider formed by the capacity between the high-voltage electrode and the measuring electrode (5) as the high-voltage capacity and the capacity of the measuring electrode (5) with respect to earth, inclusively of the capacity of the additional capacitor, as the low-voltage capacity by less than 20%.

19. A device according to claim 18, characterised in that it is provided with a supplementary capacitor (13) one electrode of which is electrically conductively connected to the guard electrode (7) and the other electrode of which is earthed.

20. A device according to claim 19, characterised in that said guard electrode (7) is earthed via a compensating device (14) the impedance of which is dimensioned in such a way that the time constants for the discharges of the measuring electrode (5) and the guard electrode (7) are at least approximately equal.

21. A device according to claim 20, having said high voltage electrode being a cylindrical shape and said measuring electrode (5) being constructed in the shape of a cylindrical jacket and which coaxially surrounds said high-voltage electrode;

said guard electrode has three parts in the shape of cylindrical jackets, a first part (8) which coaxially surrounds the measuring electrode (5) and extends past it on both sides in axial direction, and a second and a third part (9a, 9b), which in each case have the same diameter as the measuring electrode (5) and on both sides join the first part coaxially surrounding the high-voltage electrode.

22. A device according to claim 21, characterised in that said low-voltage electrode (3) extends in axial direction on both sides past the guard electrode (7) and its inner wall is constructed at least partially in the shape of a cylindrical jacket at the parts extending past the guard electrode (7), said inner wall is located coaxially with respect to the high-voltage electrode and has the same radius as the measuring electrode (5).

* * * * *